United States Patent [19]

Mangelsdorf et al.

[11] Patent Number: 5,736,886
[45] Date of Patent: Apr. 7, 1998

[54] INPUT CLAMPING METHOD AND APPARATUS WITH A CORRELATED DOUBLE-SAMPLING CIRCUIT

[75] Inventors: Christopher W. Mangelsdorf, Reading; Katsufumi Nakamura, Cambridge, both of Mass.

[73] Assignee: Analog Devices, Inc., Norwood, Mass.

[21] Appl. No.: 596,029

[22] Filed: Feb. 6, 1996

[51] Int. Cl.$^6$ .................... H03K 5/08; H04N 5/217
[52] U.S. Cl. .................... 327/310; 327/95; 327/551; 348/241; 348/243
[58] Field of Search .................... 348/241, 243, 348/251; 327/310, 309, 327, 332, 551, 95, 94, 96

[56] References Cited

U.S. PATENT DOCUMENTS

| | | | |
|---|---|---|---|
| 4,287,441 | 9/1981 | Smith | 327/94 |
| 4,454,545 | 6/1984 | Duschl | 348/312 |
| 4,599,640 | 7/1986 | Dischert | 348/265 |
| 4,914,518 | 4/1990 | Suga | 348/243 |
| 5,032,740 | 7/1991 | Kannegundla | 327/309 |
| 5,194,943 | 3/1993 | Tomita et al. | 348/255 |
| 5,260,794 | 11/1993 | Sase et al. | 348/241 |
| 5,276,508 | 1/1994 | Boisvert et al. | 327/91 |
| 5,517,240 | 5/1996 | Fukatsu | 348/223 |

*Primary Examiner*—Timothy P. Callahan
*Assistant Examiner*—Terry L. Englund
*Attorney, Agent, or Firm*—Wolf, Greenfield & Sacks, P.C.

[57] ABSTRACT

A method and apparatus for removing low frequency noise and any offsets common to a plurality of samples of a signal, for calibrating an offset level to be added to the signal to reference the signal to a desired reference level at an output of the apparatus, and for clamping an input voltage level to the apparatus to a desired voltage within an operating range of the apparatus. The apparatus includes a correlated double-sampling circuit which takes a first sample and a second sample of the analog signal, takes a difference between the first sample and the second sample to remove low frequency noise and any offsets common to both samples and which outputs a difference signal. In addition, the apparatus includes a black level correction circuit which adds an offset level to the difference signal to calibrate the offset level to be added to the difference signal so that the difference signal is at a desired reference level at an output of the apparatus. Further, the apparatus includes a clamping circuit which clamps a voltage at the output of the correlated double-sampling circuit to a desired voltage level at the input to the correlated double-sampling circuit and within the supply range and operating range of the apparatus.

22 Claims, 14 Drawing Sheets

INPUT CLAMPING METHOD AND APPARATUS WITH A CORRELATED DOUBLE-SAMPLING CIRCUIT

BACKGROUND OF THE INVENTION

1. Field of the Invention

The present invention relates to a method and apparatus for clamping an input voltage level to an apparatus to a desired voltage. In particular, the invention relates to input clamping circuit that can be used with a camcorder system to calibrate black pixels output by the charge coupled device.

2. Description of the Related Art

FIG. 1 illustrates a block diagram of a front end 20 of a CCD interface circuit which may be used for example in a camcorder system. The front end includes a charge coupled device (CCD) sensor 22 which detects and outputs an analog signal on line 24, to be processed by the camcorder. The analog signal on line 24 is fed to a correlated double sampling circuit 26 which takes a first sample and a second sample of the analog signal, which takes a difference between the first and second samples to remove low frequency noise and any offsets common to both samples of the signal, and which outputs a difference signal on line 28. The difference signal on line 28 is amplified by amplifier 30 and an amplified signal is output on line 32 to a black level correction circuit 34. The black level correction circuit 34 adds an offset level to the amplified signal on line 32 so as to calibrate the amplified signal to a desired reference level. In particular, the offset level is calibrated to substantially one end of an input range of analog-to-digital converter 38 when the charge coupled device 22 outputs a signal on line 24 corresponding to black pixels. The black pixels are intentionally added around a periphery of the CCD for the purpose of calibrating the offset level. In addition, when the analog signal output on line 24 corresponds to pixels of an image detected by the CCD, the black level correction circuit adds the calibrated offset value to the amplified signal on line 32 corresponding to the pixel image. Thus, the correlated double sampling circuit 26 and the black level correction circuit 34 together filter out low frequency noise from the analog signal output by the CCD and add the calibrated offset value to the difference signal. A resulting signal is output on line 36 to the analog-to-digital converter 38, and is converted into a digital value output on line 40. The digital value is then processed by digital signal processor 42.

FIGS. 2a and 2b show a block diagram and a timing diagram, respectively of an embodiment of the correlated double sampling circuit 26 of FIG. 1. As discussed above, the correlated double sampling circuit is used to remove low frequency noise and offsets from an analog signal. In particular, it is used at the output of the CCD device 22 because it can remove several kinds of noise, e.g., reset noise from CCDs which result because the CCD doesn't always reset to exactly the same value and flicker (1/f) noise of the CCD. A basic principle of the circuit is that the first and second samples are taken of the analog signal output from a single channel of the CCD device, a first sample is taken with the analog signal at the reset level and a second signal is taken with the pixel data level signal included in the analog signal. A difference between the two samples is then taken so that any noise or offset common to both samples is removed from the difference of the two samples.

More specifically, the correlated double sampling circuit 26 of FIG. 2a includes a first sample-and-hold circuit 44, a second sample-and-hold circuit 46 and third sample-and-hold circuit 48. Referring to the timing diagram of FIG. 2b, the first sample-and-hold circuit is responsive to clock signal Q1 so that on a falling edge 50 of the clock signal Q1, the first sample is taken of the analog signal at the reset level on line 24. In the camcorder system of FIG. 1, the correlated double sampling circuit takes advantage of a known condition of the CCD circuit 22. In particular, the CCD circuit is always reset before a new pixel is measured. The CDS circuit of FIG. 2a takes advantage of this existing condition by sampling the signal at the output line 24 of the CCD circuit during this reset phase, before the new pixel information appears. Thus, in response to the falling edge 50 of the clock signal Q1, the first sample of the signal on line 24 represents the reset level of the signal from the CCD circuit 22. On a falling edge 52 of clock signal Q2, the first sample is clocked into the second sample-and-hold circuit 46 and at the same time, the third sample-and-hold circuit 48 takes the second sample of the analog signal having the new pixel information on line 24. The second sample is a data level sample of an intensity of the new pixel information signal output by the CCD circuit 22. The first sample and the second sample are output to difference element 54 which performs a difference operation on the first and second samples and provides the difference signal on line 28 free of any noise or offset that is common to both samples.

However, one problem with the circuit of FIG. 2a is that a time period for which the filtered signal on line 28 is valid is not a complete period of the pixel information signal on line 24. According to this disclosure it is to be understood that a pixel period is defined as a time period between falling edge transitions of the clock signal $Q_2$, and includes times for which the analog signal at the reset level and the analog signal at the data level are present on line 24. For the circuit of FIG. 2a, as the clock signal Q2 transitions to the high state, the sample and hold-circuit 48 is in acquisition mode and the output of the circuit on line 28 is no longer valid. Thus, the period for which the difference signal on line 28 is valid is not a full pixel period. For example, if the clock signal $Q_1$ and $Q_2$ have a 50% duty cycle of the pixel period, the period for which the difference signal is valid is only half of the pixel period.

In addition, another problem with the circuit of FIG. 2a is that the sample-and-hold circuit 46 is driven by the sample-and-hold circuit 44. Consequently capacitors of the sample-and-hold circuit 46 must either be relatively small which results in a noisy signal output by the circuit 26, or if the capacitors are relatively large, the sample-and-hold-circuit 44 must supply enough power to drive the capacitors which in turn has to be dissipated in the circuit of FIG. 2a.

FIG. 3 illustrates the correlated double sampling circuit 26 of FIG. 2a together with two feedback circuits to form an input clamping circuit 180. The operation of the correlated double sampling circuit 26 is as discussed above with respect to FIG. 2a. The input clamping circuit includes feedback circuits 182 and 184 which are provided to level shift a voltage of the signal on line 24 to within a supply range and operating range of the circuit 180. For example, a voltage on the line 24 may be 10 volts, but the circuit 180 may operate off of a 5 volt supply. Therefore, there is a need to clamp the voltage at the input to the correlated double sampling circuit 26 to within an operating range of the correlated double sampling circuit. The feedback circuits 182 and 184 clamp the input voltage on lines 186 and 188 to the desired voltage selected to be within the operating range of the circuit 180.

FIG. 4 illustrates a block diagram of an embodiment of the black level correction circuit 34 of FIG. 1. As described above, the signal output by the CCD circuit 22 on line 24 is processed by the correlated double sampling circuit 26 and the resulting difference signal on line 28 is passed to the programmable amplifier 30. An offset value on line 56 is added to the amplified signal on line 32 at summing block 58. The resulting signal output from the summing block on line 36 is then digitized by the analog to digital converter 38. One purpose of the black level correction circuit is to calibrate the value of the offset signal on line 56 so as to reference the resulting signal on line 36 substantially to one end of the input range of the analog-to-digital converter. For example, the amplified signal on line 32 may be in a range from 0 to 1 volt, and the offset level on line 56 may be added to adjust the resulting signal range from −0.5 volts to +0.5 volts. The black pixels are intentionally provided around the periphery of the CCD circuit 22 for this particular purpose. More specifically, when the signal on line 24 corresponding to the black pixels is input to the black level correction circuit 34, the switch 62 is biased to a closed position to provide a closed feedback loop including summing block 64 and integrator 66, so that the signal on line 36 is fed back to the summing block 58 as the offset value on line 56. The feedback loop including the integrator 66 and the summing block 64, compares the signal on line 36 to a negative reference value on line 68 and clamps the offset level on line 56 to the correct level to reference the signal on line 36 to the negative reference value on line 68. In addition, when the analog signal on line 24 corresponds to the data level of the intensity of the new pixel information signal, the switch 62 is biased to an open position so that the integrator holds the calibrated offset level and the calibrated offset level value is added to the amplified signal on line 32 corresponding to the intensity of the new pixel information signal.

However, one problem with the black level correction circuit of FIG. 4 is that the programmable amplifier 30 may saturate under high gain conditions where the filtered signal on line 28 has only modest errors, or when the programmable gain amplifier 30 has modest input referred offsets. For example, if the camcorder system of FIG. 1 is operated on a 3 volt supply, if the analog-to-digital converter 38 has a +/−0.5 volt signal dynamic range at its input, and if the programmable amplifier has a gain of 50, an offset value of 10 millivolts will be amplified by the programmable amplifier 30 and the amplified signal on line 32 will be at 0.5 volts, thus saturating the input range of the analog-to-digital converter. In addition, another problem with the circuit of FIG. 4 is that the programmable amplifier 30 has a limited linear operating range. In particular, the circuit of FIG. 4 is a differential system having a zero point which does not change with gain of the programmable amplifier, and which is at mid-scale of the amplifier's linear operating range. Accordingly, only half of the amplifier's linear operating range is used.

Accordingly, it is an object of the present invention to improve upon the correlated double sampling circuit, the black level correction circuit, and the input clamping circuit of the related art.

SUMMARY OF THE INVENTION

According to still another aspect of the present invention, an input clamping circuit is disposed between a differential output of a correlated double-sampling circuit and an input of the correlated double-sampling circuit and clamps a common mode of a differential signal at the differential output of the correlated double-sampling circuit to a desired voltage value at the input of the correlated double-sampling circuit. The correlated double-sampling circuit includes a dividing network having a first input terminal coupled to a first output of the differential output, a second input terminal coupled to a second output of the differential output, and an output terminal. The dividing network takes an average of the differential signal at the differential output of the correlated double sampling circuit and provides the average to the output terminal. Further, the input clamping circuit includes a differential amplifier having a first input coupled to the output terminal of the dividing network, a second input terminal coupled to a bias voltage, and an output coupled to the input of the correlated double-sampling circuit.

With this arrangement, the input clamping circuit does not interfere with a black level correction circuit feedback path which is part of the correlated double-sampling circuit. In addition, the input clamping circuit can be implemented with a single differential amplifier.

According to another aspect of the present invention, an integrated circuit includes a first correlated double sampling circuit in parallel with a second correlated double sample circuit. The first correlated double sampling circuit takes a first sample of a signal at an input and a second sample for the signal at the input and performs a difference between the first sample and the second sample to provide a first filtered signal at a first output. The second correlated double sampling circuit takes a third sample of the signal at the input and a fourth sample of the signal at the input and performs a difference operation between the third sample and the fourth sample to provide a second filtered signal at a second output. The integrated circuit also includes a first summing circuit and a second summing circuit. The first summing circuit has a first input coupled to the first output and a second input coupled to a first reference value, and sums the first filtered signal and the first reference value and provides at an output a first summed signal. The second summing circuit has a first input coupled to the second output and a second input coupled to a second reference value, sums the second filtered signal with the second reference value and provides at an output a second summed signal. The integrated circuit further comprises a switching circuit having a first input coupled to the output of the first summing circuit and a second input coupled to the output of the second summing circuit, the switching circuit alternately provides one of the first summed signal and the second summed signal as a selected signal at an output of the switching circuit. Still further, the integrated circuit includes a first programmable amplifier having an input coupled to the output of the switching circuit that amplifies the selected signal and provides an amplified signal at an output of the first programmable amplifier. In addition, the integrated circuit includes a second switching circuit have an input coupled to the output of the first programmable amplifier, that alternately provides the amplified signal to one of a first output and a second output as a selected signal. Still further, the integrated circuit includes a third summing circuit and a fourth summing circuit. The third summing circuit has a first input coupled to the first output of the second switching circuit and a second input coupled to a reference signal, it sums the selected signal with the reference signal and provides a third summed signal at an output of the third summing circuit. The fourth summing circuit has a first input coupled to the second output of the second switching circuit and a second input coupled to the reference signal, it sums the selected signal with the reference signal and provides a fourth summed signal at an output. The integrated circuit further comprises a first integration circuit and a second integration circuit. The first integration circuit has an input coupled to the output of the third summing circuit and integrates the third summed signal to provide at an output the first offset level. The second integration circuit has an input coupled to the output of the fourth summing circuit and integrates the fourth summed signal to provide the second offset level.

BRIEF DESCRIPTION OF THE DRAWINGS

Other objects and features of the present invention will become apparent from the following detailed description when taken in connection with the following drawings. It is to be understood that the drawings are for the purpose of illustration only and are not intended as a definition of the limits of the invention.

The foregoing and other objects and advantages will be more fully appreciated from the following drawing in which.

DETAILED DESCRIPTION OF THE INVENTION

Figure 5A:
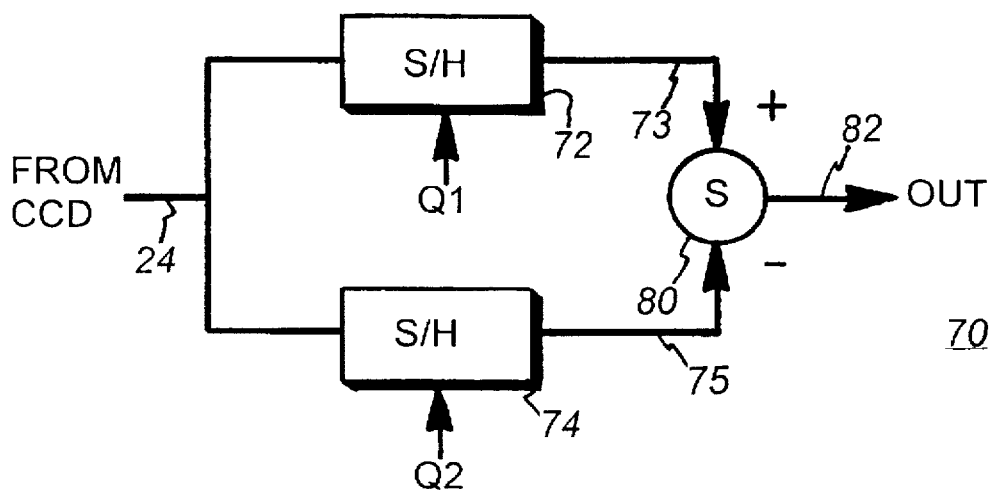
FIGS. 5a and 5b are a block diagram and a timing diagram, respectively of an embodiment of a sampling cell of a correlated double sampling circuit according to an embodiment of the present invention.
Figure 5B:
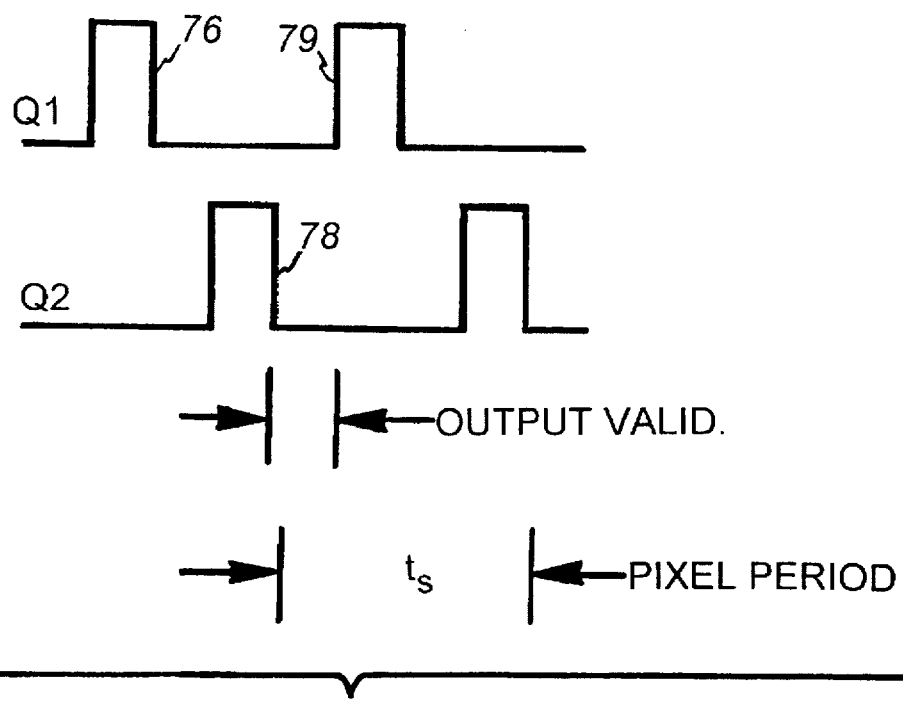

FIG. 5 is a block diagram of an embodiment of a sampling cell 70 of a correlated double-sampling circuit according to the present invention. The sampling cell 70 includes a first sample-and-hold circuit 72 in parallel with a second sample-and-hold circuit 74. The first sample-and-hold circuit 72 is responsive to the clock signal Q1 and the second sample-and-hold circuit 74 is responsive to the clock signal Q2. The first sample-and-hold circuit 72 samples the analog signal on line 24 at the falling edge 76 of the clock signal Q1, corresponding to the reset level of the signal output by the CCD circuit 22. In addition, the second sample-and-hold circuit 74 samples the analog signal on line 24 corresponding to the data level of the pixel signal output from the CCD circuit, at the falling edge 78 of the clock signal Q2. A difference of the samples is then determined at the difference element 80.

One problem with the sampling cell 70 is that the output valid time period for which the difference signal is valid is relatively short. In particular, the difference signal on line 82 is valid from the falling edge 78 of the clock signal Q2 to a rising edge 79 of the clock signal Q1, after which the sample-and-hold circuit 72 is again in acquisition mode for a next sample of the reset level of the analog signal on line 24. Since the first sample corresponding to the reset level and the second sample corresponding to the data level of the analog signal output from the CCD circuit 22 are typically a half clock cycle apart, the period for which the difference signal on line 82 is valid is:

$$Tvalid = (0.5/Fs) - Tacq \qquad (1)$$

Figure 6:
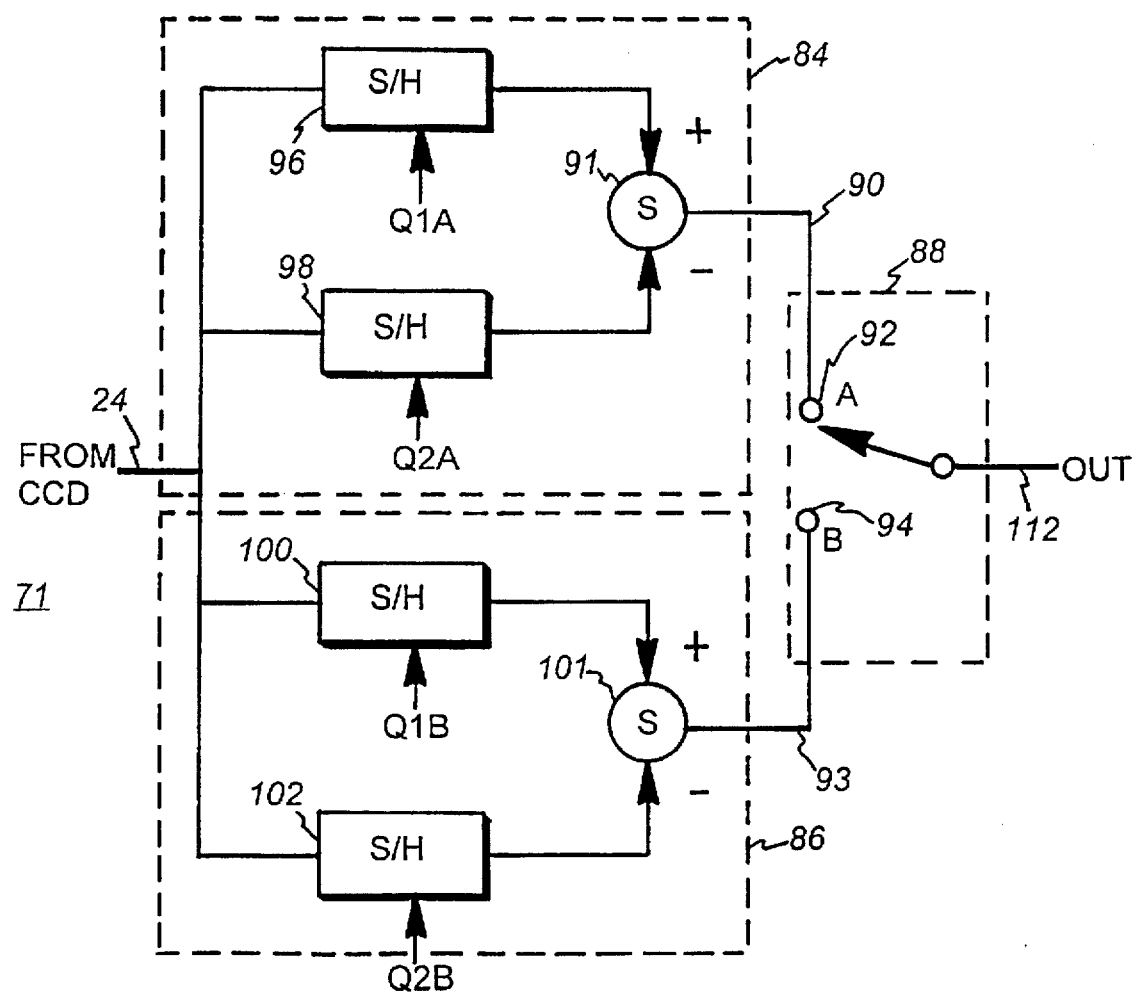
FIG. 6 is a block diagram of an embodiment of a correlated double sampling circuit according to the present invention.

FIG. 6 is a block diagram of an embodiment of the correlated double sampling circuit according to the present invention. The circuit of FIG. 6 includes two sampling cells 84 and 86 disposed in a ping-pong configuration, in parallel between the input line 24 and a single-pole, double-throw switch 88. In particular, an output line 90 of the first sampling cell 84 is coupled to a first throw 92 of the single-pole, double-throw switch, and an output line 93 of the second sampling cell 86 is coupled to a throw 94 of the single-pole, double-throw switch.

Figure 7:
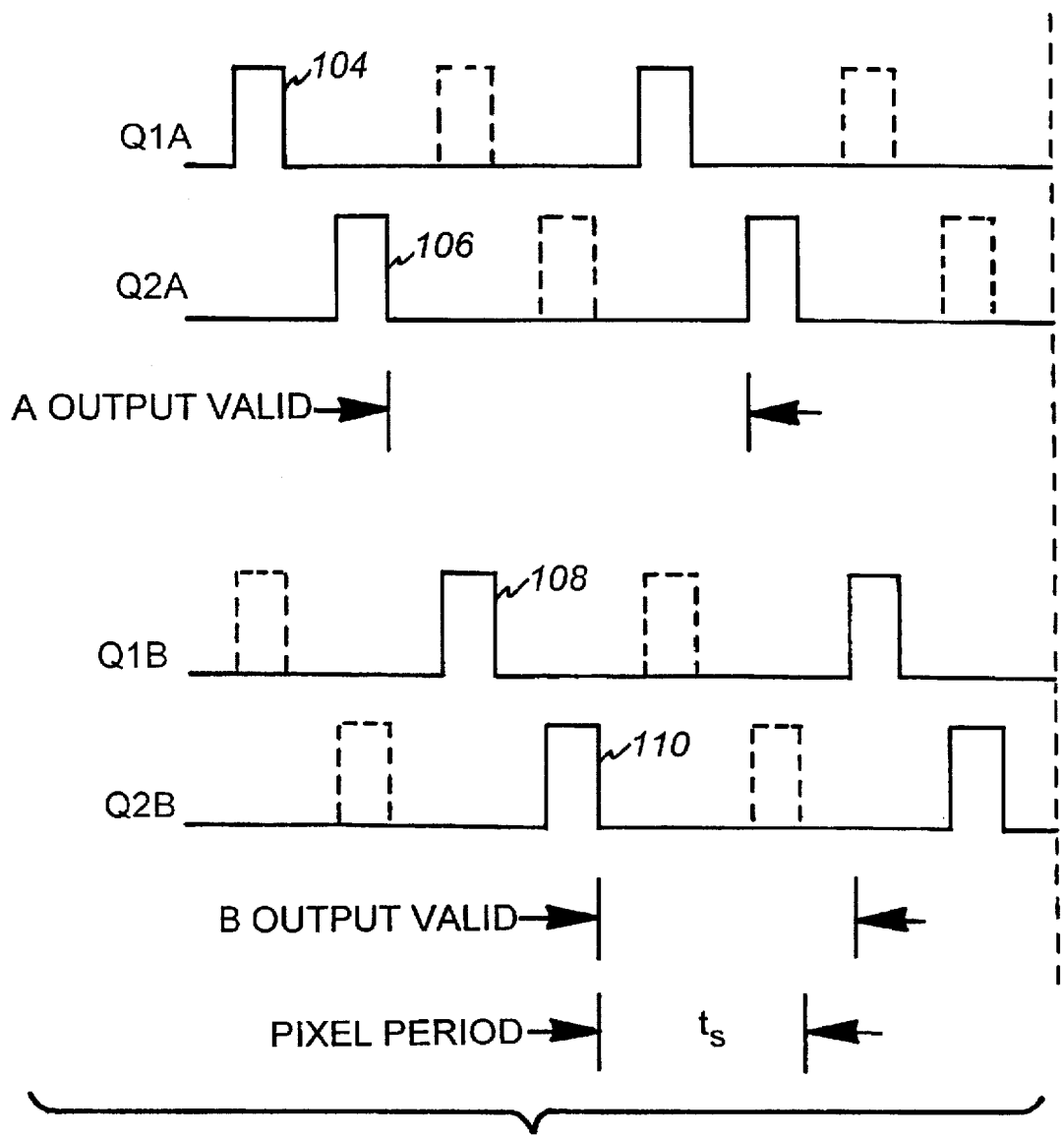
FIG. 7 is a timing diagram of the correlated doubling sampling circuit of FIG. 6.

Referring to the timing diagram of FIG. 7, an advantage of the circuit of FIG. 6 is that the output valid period time for which the difference signal on line 112 is valid is at least the pixel period. In particular, the single-pole, double-throw switch 88 switches between the difference signal on line 90 which is valid for at least a first half of the period of the pixel information signal on line 24, and the difference signal on line 93 which is valid for at least a second half of the pixel period of the pixel information signal on line 24. More specifically, a first sample-and-hold circuit 96 of sampling cell 84 samples the reset level of the analog signal on line 24 at the falling edge 104 of signal Q1A, and second sample-and-hold circuit 98 samples the signal on line 24 at a falling edge 106 of clock signal Q2A. The difference signal of the two samples is taken by difference element 97 and output on line 90. The difference signal on line 90 is valid for at least half of the pixel period of the analog signal on line 24 while the second sampling cell 86 goes into acquisition mode. During the acquisition mode of the second sampling cell 86, first sample-and-hold circuit 100 samples the reset level of the analog signal on line 24 at falling edge 108 of clock signal Q1B, and second sample-and-hold circuit 102 samples the data level of the analog signal on line 24 at falling edge 110 of clock signal Q2B. The difference signal of the two samples is taken by difference element 101 and output on line 93. The difference signal on line 93 is also valid for at least half of the pixel period of the analog signal on line 24. Since the respective outputs 90 and 93 of each of the sampling cells 84 and 86 is valid for at least half of the pixel period of the pixel signal, the output of the filtered signal on line 112 is valid for the at least the pixel period of the signal at line 24.

Figure 8A:
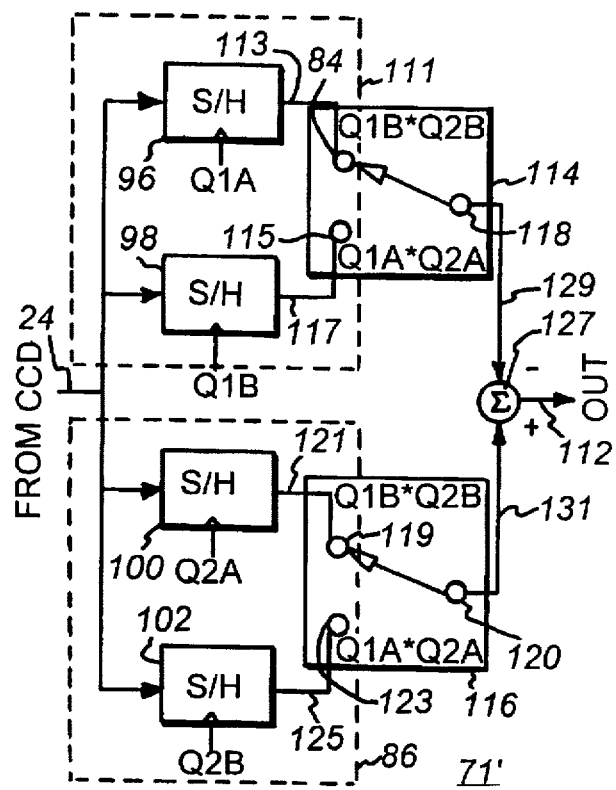
FIGS. 8a and 8b illustrate an alternative embodiment and a timing diagram, respectively of the correlated double sampling circuit according to the present invention.
Figure 8B:
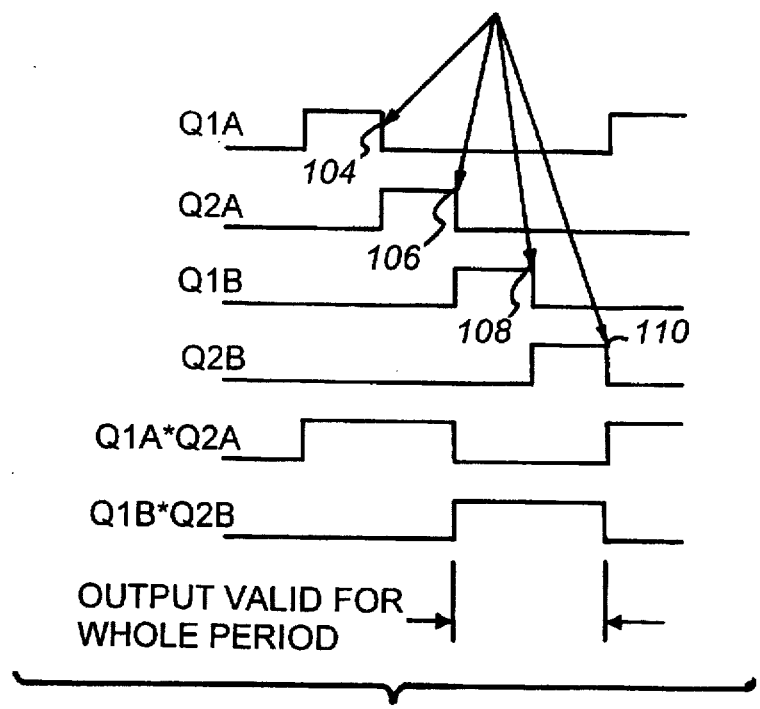

FIG. 8a illustrates an alternative embodiment of the correlated double sampling circuit 71'. In the circuit of FIG. 8a, the difference operation and the switching operation are reversed. In particular, the circuit of FIG. 8a includes two sampling cells 84 and 86 disposed in the ping-pong structure between the signal line 24 and the signal line 112. In contrast to FIG. 6, the circuit of FIG. 8a includes two single-pole, double-throw switches 114 and 116 disposed at corresponding outputs of the sampling cells 84 and 86. A first pole 111 of single-pole, double-throw switch 114 is coupled to an output 113 of sample-and-hold circuit 96 and a second pole 115 of single-pole, double-throw switch 114 is coupled to an output 117 of sample-and-hold circuit 98. In addition a first pole 119 of single-pole, double-throw switch 116 is coupled to an output 121 of sample-and-hold circuit 100, and a second pole 123 of single-pole, double-throw switch 116 is coupled to an output 125 of sample-and-hold circuit 102. Poles 118 and 120 of single-pole, double-throw switches 114 and 116 are coupled to differencing circuit 127.

As was discussed above with respect to FIG. 7, the sample-and-hold circuit 96 of the sampling cell 84 samples the reset level of the analog signal on line 24 at the falling edge 104 of the signal Q1A. The sample-and-hold circuit 100 samples the data level of the analog signal on line 24 at the falling edge 106 of the clock signal Q2A. In addition, the sample-and-hold circuit 98 samples the reset level of the analog signal on line 24 at the falling edge 108 of clock signal Q1B, and the sample-and-hold circuit 102 samples the data level of the analog signal on line 24 at the falling edge 110 of clock signal Q2B. The single-pole, double-throw switch 114 switches between output line 113 and output line 117 of respective sample-and-hold circuits 96 and 98 according to the logical AND of clock signals Q1B*Q2B and Q1A*Q2A. The single-pole, double-throw switch 116 switches between outputs 121 and 125 of respective sample-and-hold circuits 100 and 102 according to the logical AND of clock signals Q1B*Q2B and Q1A*Q2A. A difference of the signals on lines 129 and 131 is taken by difference element 127 and output on line 112 as the difference signal output from the correlated double sampling circuit. A net result of the operation of the circuit of FIG. 8a is as described above with respect to FIG. 6.

Figure 4:
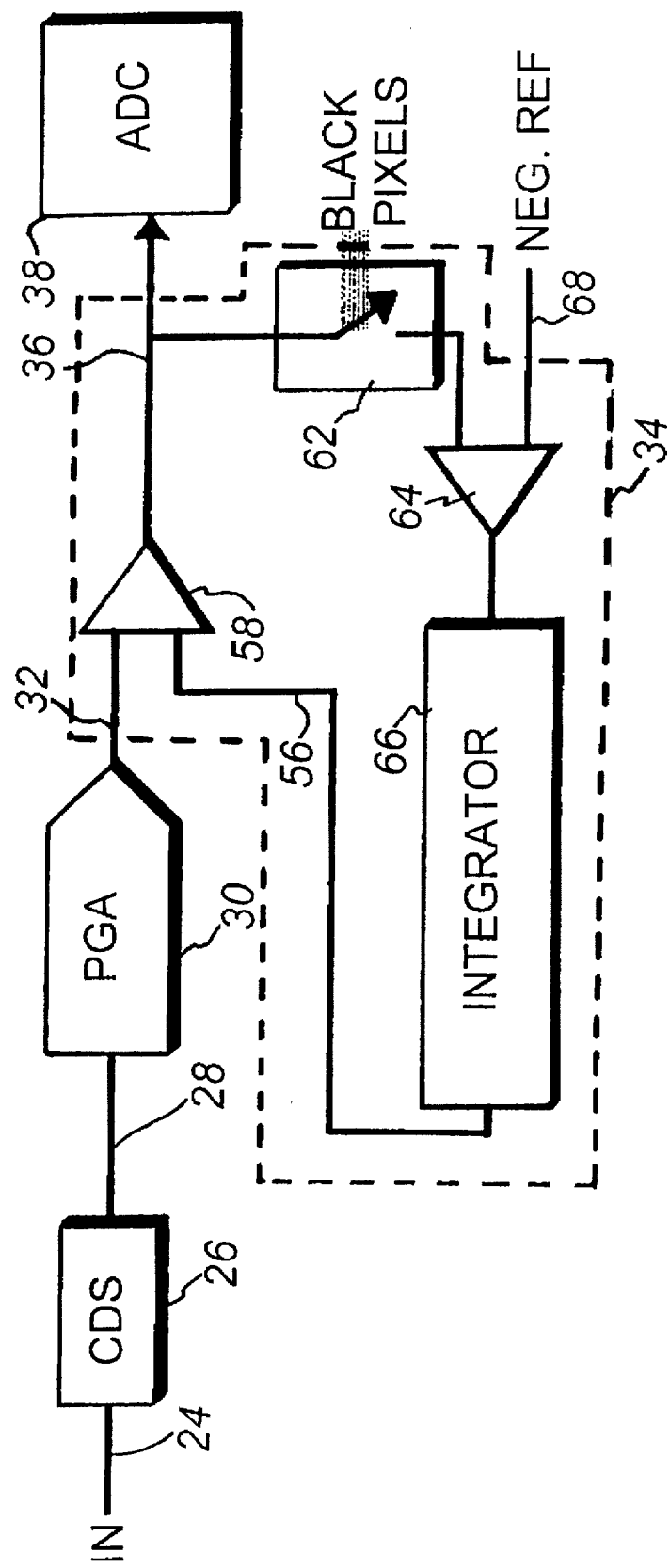
FIG. 4 is a block diagram of an embodiment of a black level correction circuit of the camcorder system of FIG. 1.
Figure 9A:
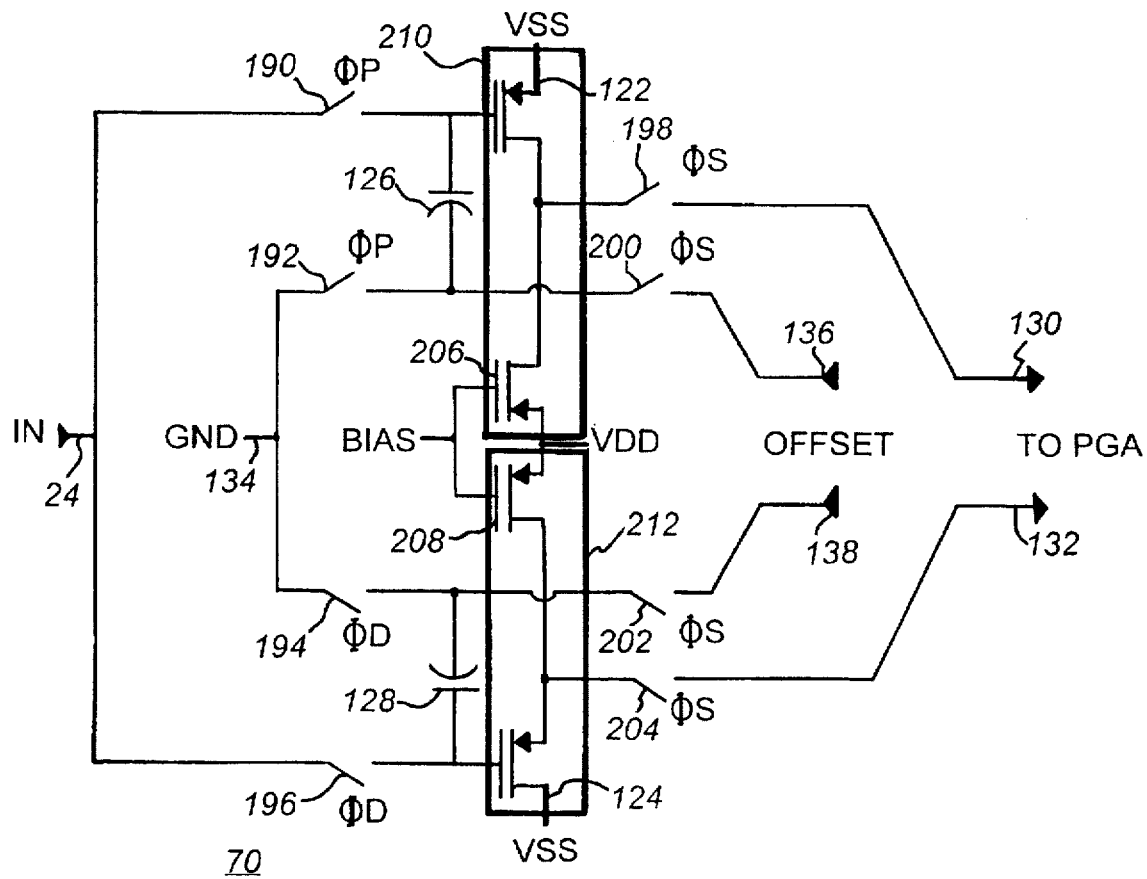
FIGS. 9a and 9b are a schematic diagram and a timing diagram, respectively of the sampling cell of FIG. 6, according to the present invention.
Figure 9B:
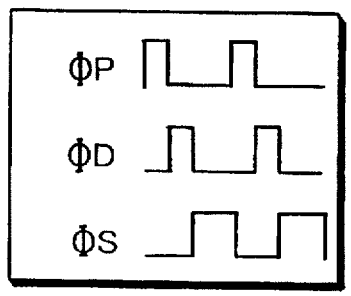

One advantage of the basic sampling cell 70 of FIG. 5a is that a circuit implementation of this sampling cell is relatively simple. For example, referring to FIG. 9a, there is disclosed a schematic diagram of an embodiment of the sampling cell 70 of FIG. 6. The circuit is implemented with a minimum of two FET devices 122 and 124 and two capacitors 126 and 128. In particular, referring to the timing diagram of FIG. 9b, the first sample of the reset level of the signal on line 24 is taken when the switches 190 and 192 are opened in response to the clock signal Φp. As the switches 190 and 192 are opened, the voltage on the capacitor 126 is sampled by the FET 122. Thereafter, the second sample corresponding to the pixel information of the signal on line 24 occurs when the switches 194 and 196 are opened. The voltage on the capacitor 128 is then sampled by the FET device 124. After obtaining the first sample and the second sample, switches 198, 200, 202 and 204 are then closed in response to the clock signal ΦS and the first and second samples are output on lines 130 and 132. Although the timing diagram of FIG. 9b discloses the switches 190 and 192 responsive to the clock signal ΦP and the switches 194 and 196 responsive to the clock signal ΦD, it is to be appreciated that in a preferred embodiment of the invention, the switches 192 and 194 are opened prior to the switches 190 and 196 to reference the second terminals of the capacitors 126 and 128 to ground prior to the opening of the switches 190 and 196. The differential signal on lines 130 and 132 corresponds to the output signals on lines 73 and 75 of the sample-and-hold circuits 72 and 74 of the sampling cell 70 of FIG. 5a. In an examplary embodiment of the invention, the difference element 80 of FIG. 5a is accomplished with the programmable amplifier 30 of the black level correction circuit (see FIG. 4), wherein the programmable amplifier 30 rejects any common-mode between the signals on lines 130 and 132. However, it is to be appreciated that any differential transconductance which rejects a common mode of a differential input signal can be used and is intended. Thus, the sampling cell 70 of FIG. 5a can be implemented with a minimum of two FET devices 122 and 124, and two capacitors 126 and 128. It is also to be appreciated that the sampling cell of FIG. 9a can be implemented in semiconductor technology, for example CMOS technology, wherein switches 190, 192, 194, 196, 198, 200, 202 and 204 can also be implemented using FET devices and that such implementation is intended. One advantage of the circuit of FIG. 9a is that no internal driving circuitry need be used to drive capacitors 126 and 128, and thus the capacitors can be driven by an external source. An advantage is that the capacitors 126 and 128 can be relatively large and therefore the signals on lines 130 and 132 will contain less noise.

The circuit of FIG. 9a also includes an input reference pin 134 which can, for example, be connected to ground and which provides a reference level for decoupling of the analog signal on line 24. In addition, the circuit of FIG. 9a also provides a differential offset adjustment of the differential signal on lines 130 and 132. For example, a voltage difference between signals on lines 136 and 138 will be added to the differential signal that is sampled from capacitors 126 and 128 and output on lines 130 and 132. Thus, the offset pins 136 and 138 can be used to compensate for differential offsets of the differential signals on lines 130 and 132. In an exemplary embodiment of the present invention, the offset pins 136 and 138 are coupled to a feedback loop of the black level correction circuit, as will be described in more detail below. Still further, the circuit of FIG. 9a provides a common mode adjustment of the differential signal provided on lines 130 and 132. The offset pins 136, 138 and the input reference pin 134 can be used to adjust the common mode of the signals sampled on capacitors 126 and 128. In particular, if the signals on offset pins 136 and 138 are different than the voltage on the input reference pin 134, the common mode of the signal on lines 130 and 132 will be different than the common mode of the analog signal on line 24. Still further, the circuit of FIG. 9a includes additional FETs 206 and 208 which in an exemplary embodiment of the invention can be added to respective FETs 122 and 124 to provide corresponding unity gain buffers 210 and 212. In particular, FET 122 in combination with FET 206 forms a source follower having a unity gain and FET 124 in combination with FET 208 is also a source follower. The unity gain buffers 210 and 212 can be used when, for example, the programmable amplifier is drawing current and it is desired to prevent discharge of the current from capacitors 126 and 128.

Figure 1:
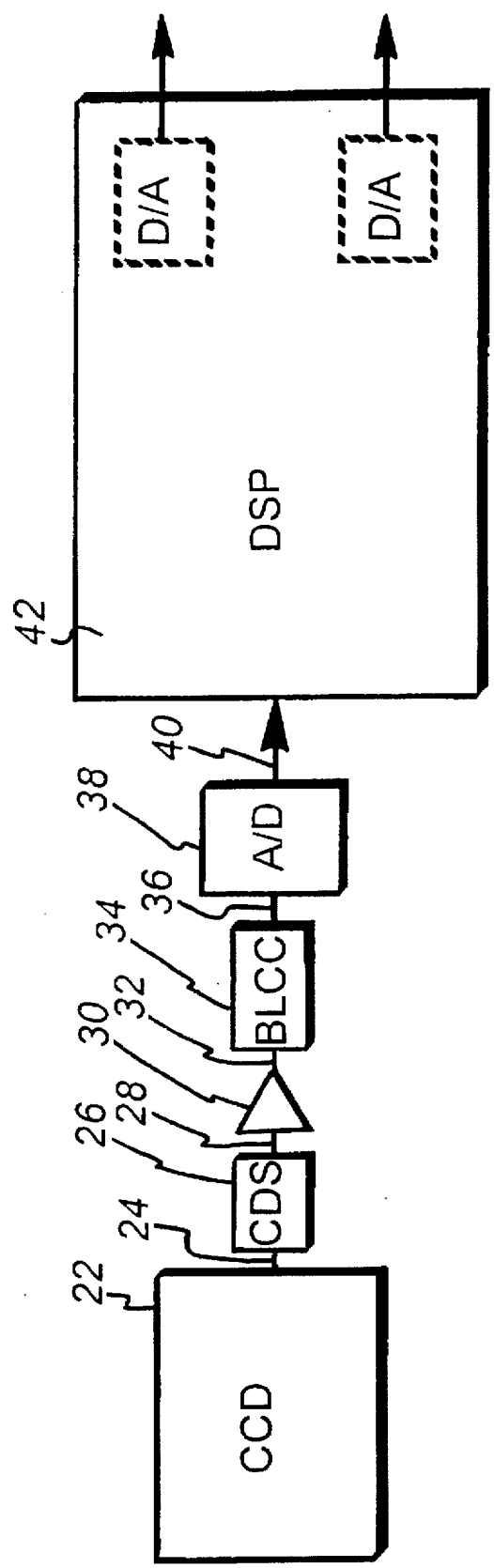
FIG. 1 illustrates a block diagram of a CCD interface as is known in the related art.
Figure 2A:
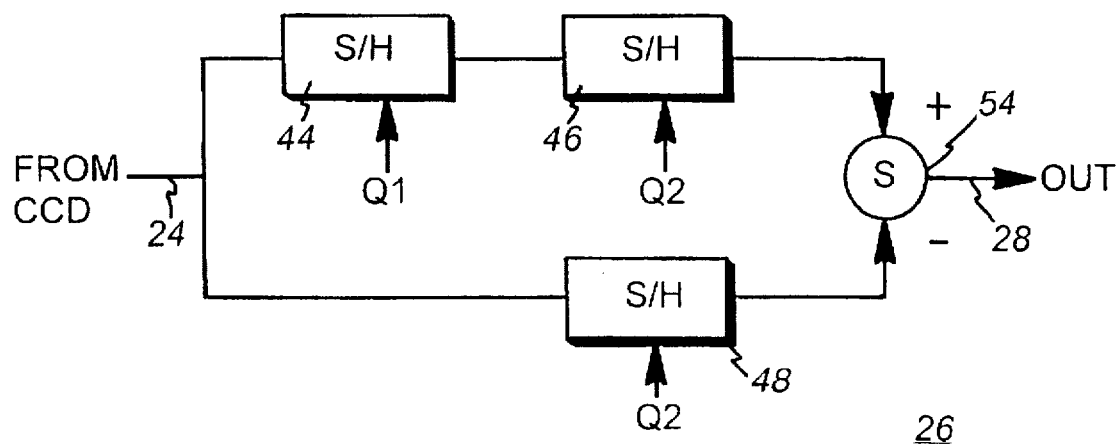
FIGS. 2a and 2b show a block diagram and a timing diagram, respectively of an embodiment of a correlated double sampling circuit of the camcorder system of FIG. 1.
Figure 2B:
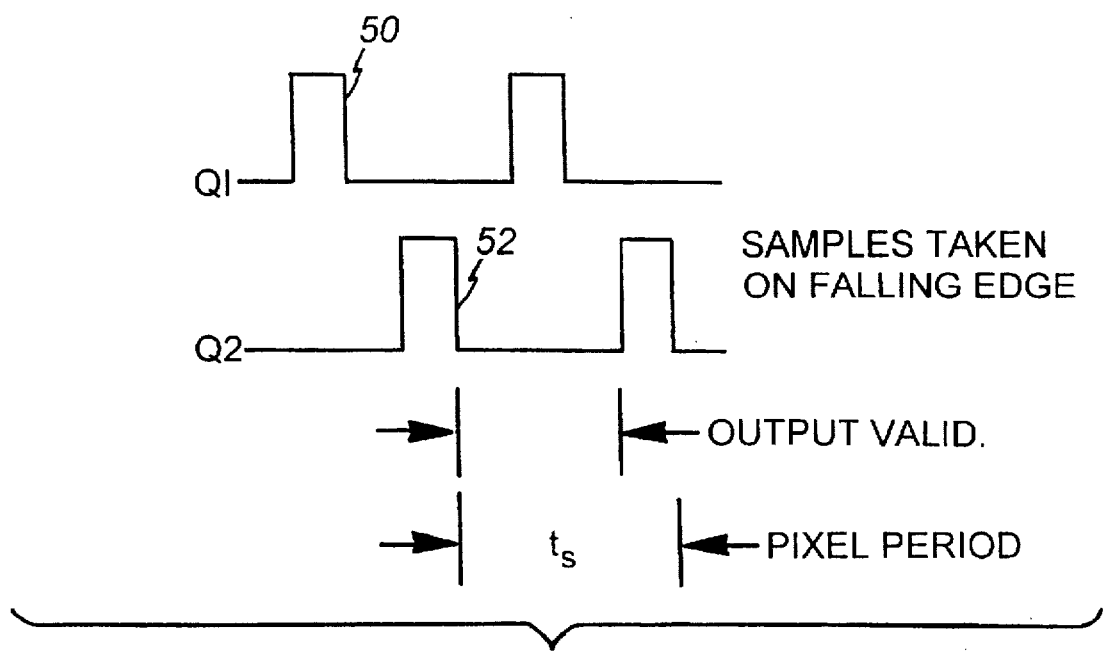

Another advantage of the sampling cell circuit of FIG. 9a is that the simplicity of the circuit lends itself to good decoupling of the analog signal on the input line 24. In addition, the simplicity of the circuit allows for offset correction of the differential signal on lines 130 and 132 to compensate for various system offsets, for example, within the camcorder system of FIG. 1. Further, the simplicity of the circuit allows for common mode adjustment of the differential signal provided on lines 130 and 132.

Figure 10:
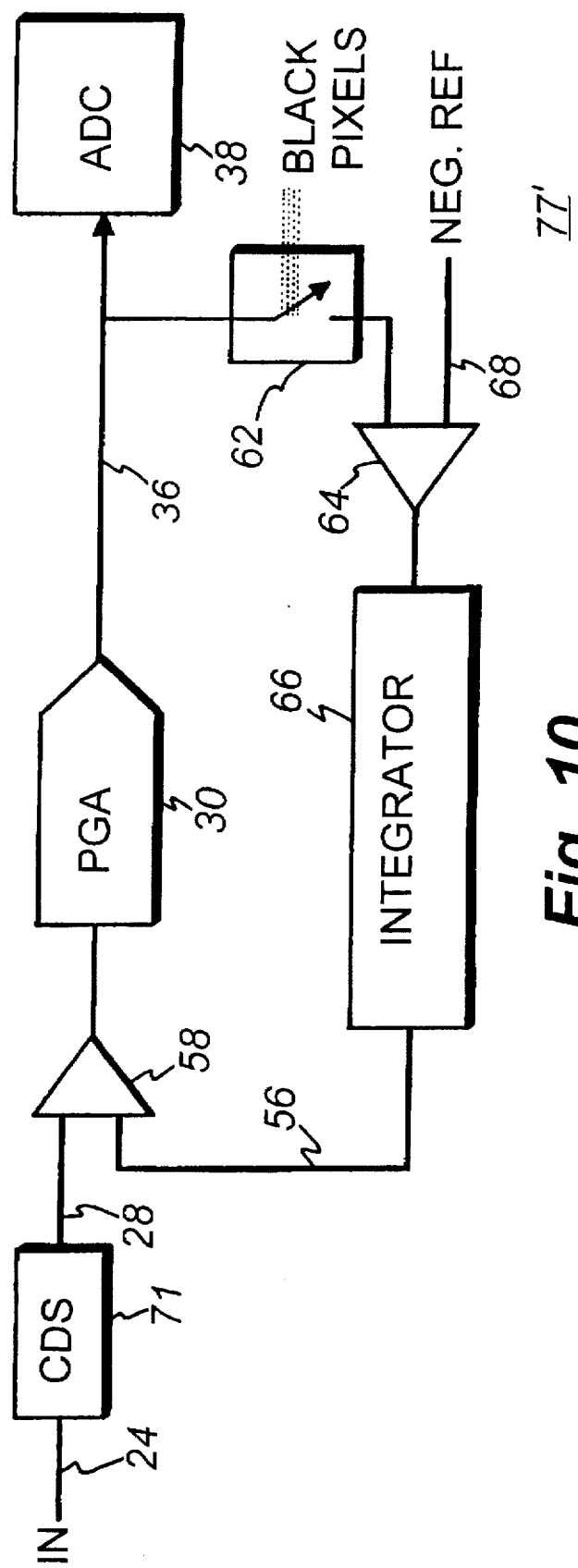
FIG. 10 is a block diagram of an embodiment of a black level correction circuit according to the present invention.

FIG. 10 illustrates a block diagram of an embodiment of a black level correction circuit 77 according to the present invention. As discussed above with respect to FIG. 4, the analog signal output by the CCD device 22 on line 24 is processed by the correlated double sampling circuit 71, and the difference signal on line 28 is output to the programmable amplifier 30. The difference signal is then amplified by programmable gain amplifier 30 and output as an amplified signal on line 36. An offset value on line 56 is added to the amplified signal on line 36 by summing block 58. One problem with the black level correction circuit of FIG. 4 is that the programmable amplifier 30 has a limited linear operating range. Accordingly, it is desirable to set the black pixel level reference level to one end of the total linear operating range of the programmable amplifier to make full use of the programmable amplifier's limited linear range. Thus, with the black level correction circuit of the present invention (FIG. 10), the offset value is added to the difference signal on line 28 before the programmable amplifier 30. As discussed above, the offset level is calibrated so as to clamp the resulting signal on line 36 to one end of the input dynamic range of the analog-to-digital converter 38. In particular, when black pixels are provided by the CCD device 22 on line 24, the switch 62 is closed to provide a closed feedback loop including summing block 64 and integrator 66, so that the signal on line 36 is fed back to the summing block 58 as the offset value on line 56. The feedback loop compares the signal on line 36 to the negative reference value on line 68 and clamps the offset level so that the signal on line 36 is set to the negative reference value. In addition, when the switch 62 is opened in response to a pixel information signal present on line 24, integrator 66 holds the calibrated offset level value and adds it to the corresponding difference signal on line 28.

The circuit of FIG. 10 has two advantages over the circuit of the related art. A first advantage is that the circuit of FIG. 10 is that the black level correction circuit can tolerate large errors in the signal from the correlated double sampling circuit of input referred offsets or the programmable gain amplifier, under high gain conditions, without saturating the amplifier and the analog-to-digital converter. In addition, a second advantage of the circuit of FIG. 10 is that the limited linear range of the programmable amplifier 30 is optimally used. In particular, by setting the reference level of the integrator to one end of the input dynamic range of the analog-to-digital converter 38, the full linear range of the programmable amplifier is used. In an exemplary embodiment of the circuit of FIG. 10, the circuit is operated from a 3 volt supply, the programmable amplifier is set to have a gain of 50, and the analog-to-digital converter has an input dynamic range of −0.5 volts to +0.5 volts. Therefore, the negative reference level 68 is set to −0.5 volts to make full use of the input dynamic range of the analog-to-digital converter 38 and the linear operating range of the amplifier 30.

Figure 11:
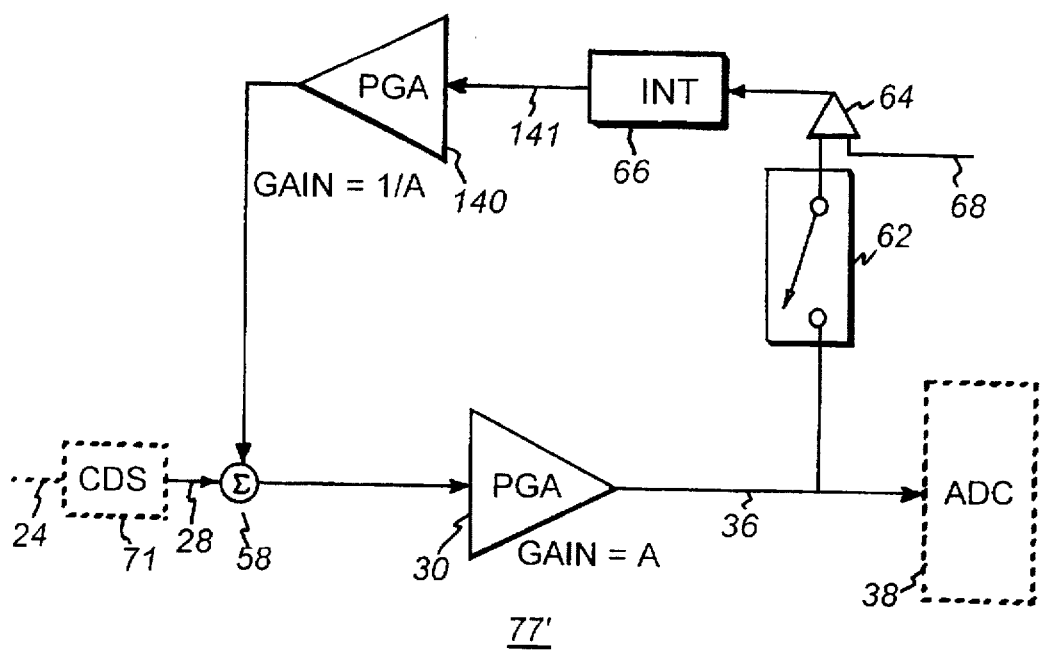
FIG. 11 is a block diagram of an alternative embodiment of the black level correction circuit, according to the present invention.

One disadvantage of the circuit of FIG. 10 is that the offset correction loop dynamics vary with gain of the programmable amplifier 30. For example, the offset level required to reference the black level to one end of the operating range varies with gain of the amplifier. Accordingly, there is disclosed in FIG. 11 an alternative embodiment of the black level correction circuit 77' according to the present invention. In the circuit of FIG. 11 an additional programmable amplifier 140 is added to the feedback loop after the integrator 66. The slope of the gain of the programmable amplifier 140 varies inversely with the slope of the gain of the programmable amplifier 30 thereby keeping the total loop gain constant. Thus, an advantage of the circuit of FIG. 11 is that the dynamics of the black level correction circuit, for example, stability, noise performance, and acquisition time are independent of the gain of the circuit. Another advantage of the circuit of FIG. 11 is that the added amplifier 140 in the feedback loop also reduces the requirements on the integrator 66. In particular, when an appropriate offset is added at line 141 after the integrator 66 before the programmable amplifier 140, an output of the integrator 66 on line 141 becomes zero and the offset required to maximize the programmable amplifier's range is generated automatically by the feedback programmable amplifier 140 with only minor corrections being provided by the integrator 66. Thus, the circuit of FIG. 11 is preferably used for an offset referred to an output of the programmable amplifier 66 because the integrator 30 does not have to change states. Still another advantage of the circuit of FIG. 11 is that the correct offset value to accomplish optimal use of the limited linear range is generated by the integrator 66 independent of the programmable amplifiers gain.

Figure 12:
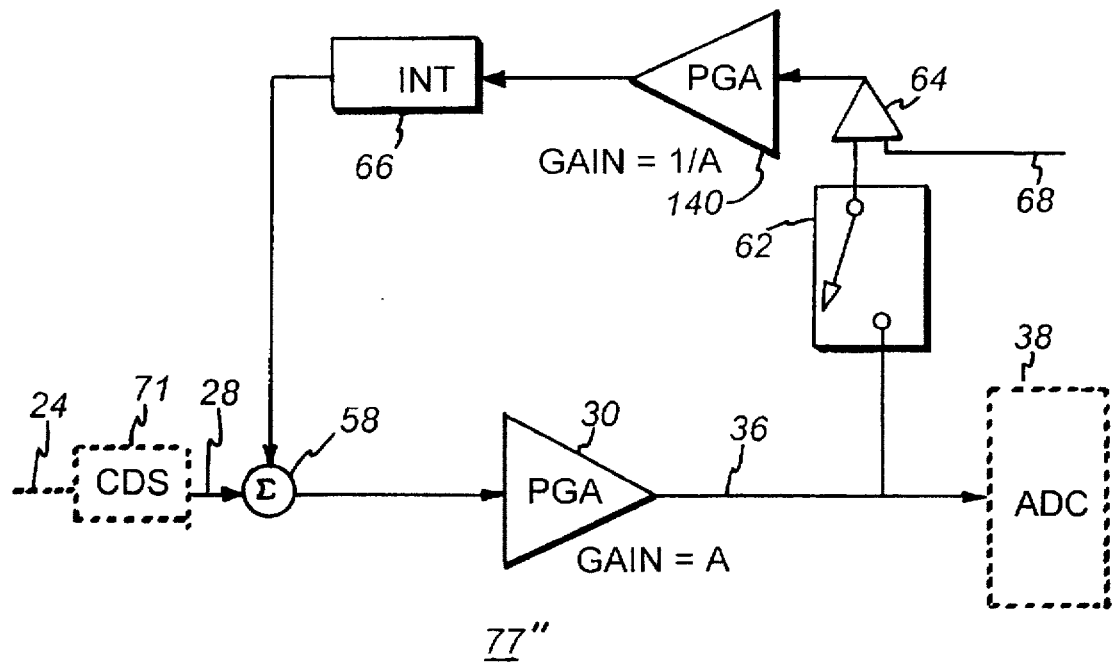
FIG. 12 is a block diagram of another alternative embodiment of the black level correction circuit, according to the present invention.

Referring now to FIG. 12, there is disclosed still an alternative embodiment 77" of the black level correction circuit according to the present invention. In the circuit of FIG. 12, the added programmable amplifier 140 is disposed before the integrator 66 in the feedback loop. According to the configuration of the circuit of FIG. 12, the integrator 66 is suited for a constant input referred offset to the programmable amplifier 30. Thus, the circuit of FIG. 12 is preferably used for an input referred offset of the programmable amplifier 30.

Figure 3:
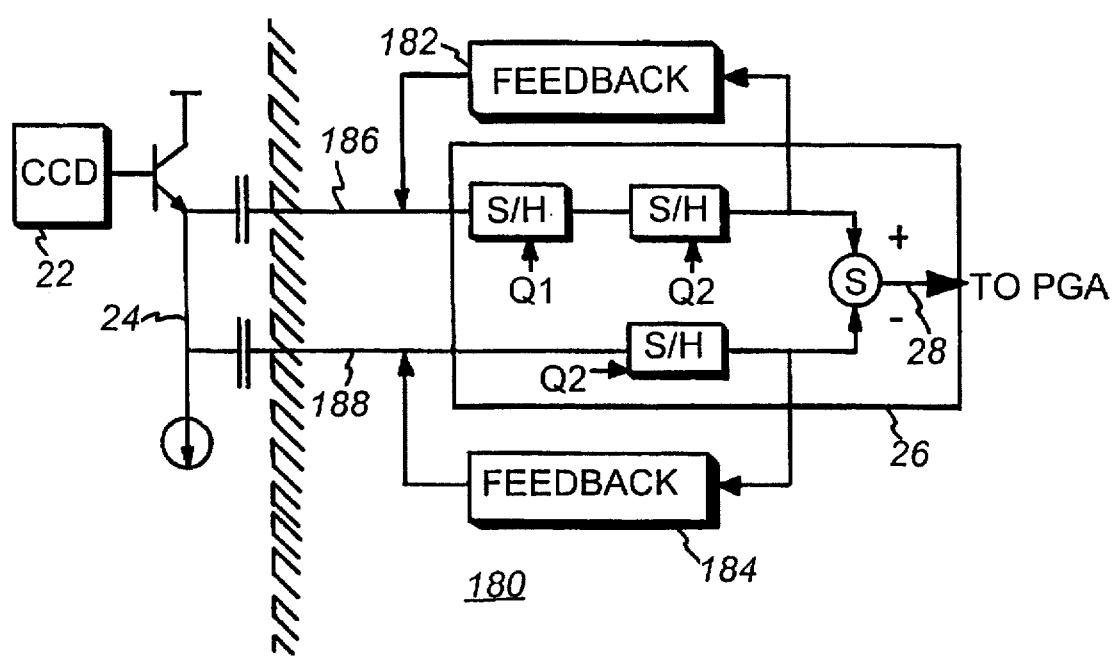
FIG. 3 is a block diagram of an input clamping circuit of the CCD interface of FIG. 1.
Figure 13:
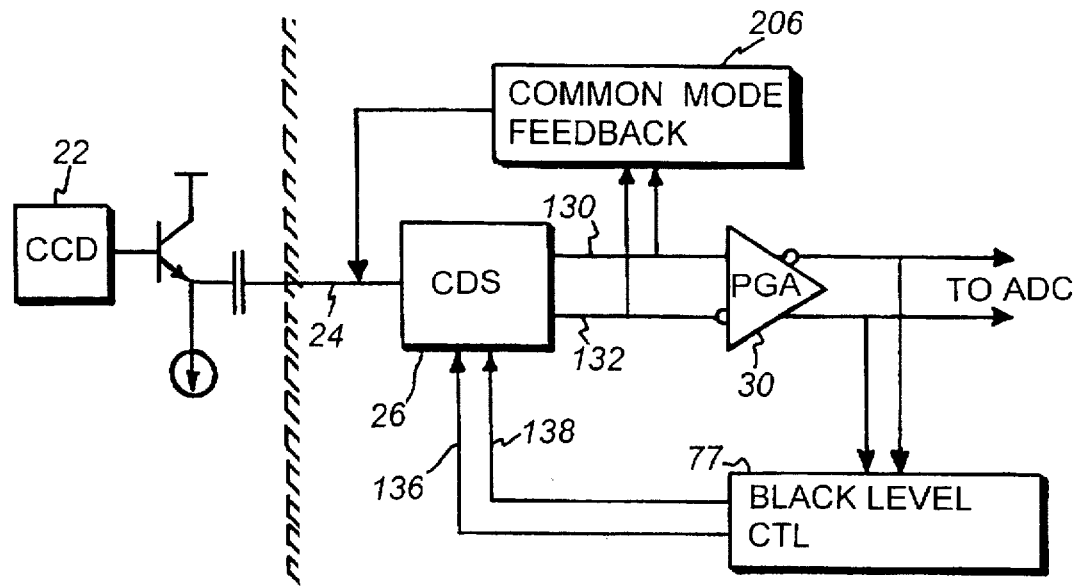
FIG. 13 is a block diagram of an input clamping circuit according to an embodiment of the present invention.

FIG. 13 illustrates a block diagram of an input clamping circuit according to an embodiment of the present invention. As was discussed above with respect to FIG. 3, the input clamping circuit clamps a voltage output by the CCD circuit to a desired voltage value within the supply range and the operating range of the correlated doubling sampling circuit 26. One problem with the circuit of FIG. 3 is that the feedback circuits 182 and 184 interfere with the feedback circuits of the black level correction circuit 77. In particular, one feedback loop can effect the other feedback loop such that neither feedback loop ever settles to the correct point desired. Accordingly, the common mode feedback circuit 206 of FIG. 13 is provided independent of the feedback loop of the black level correction circuit 77. More specifically, the common mode feedback circuit 206 is a circuit which takes a common mode of the differential signal on lines 130 and 132 output from the correlated double sampling circuit 26 and clamps the common mode back to the input of the correlated double sampling circuit on line 24. Thus the input clamping circuit, which is the common mode feedback circuit 206 in this case, does not interfere with the black level correction circuit 77.

Figure 14:
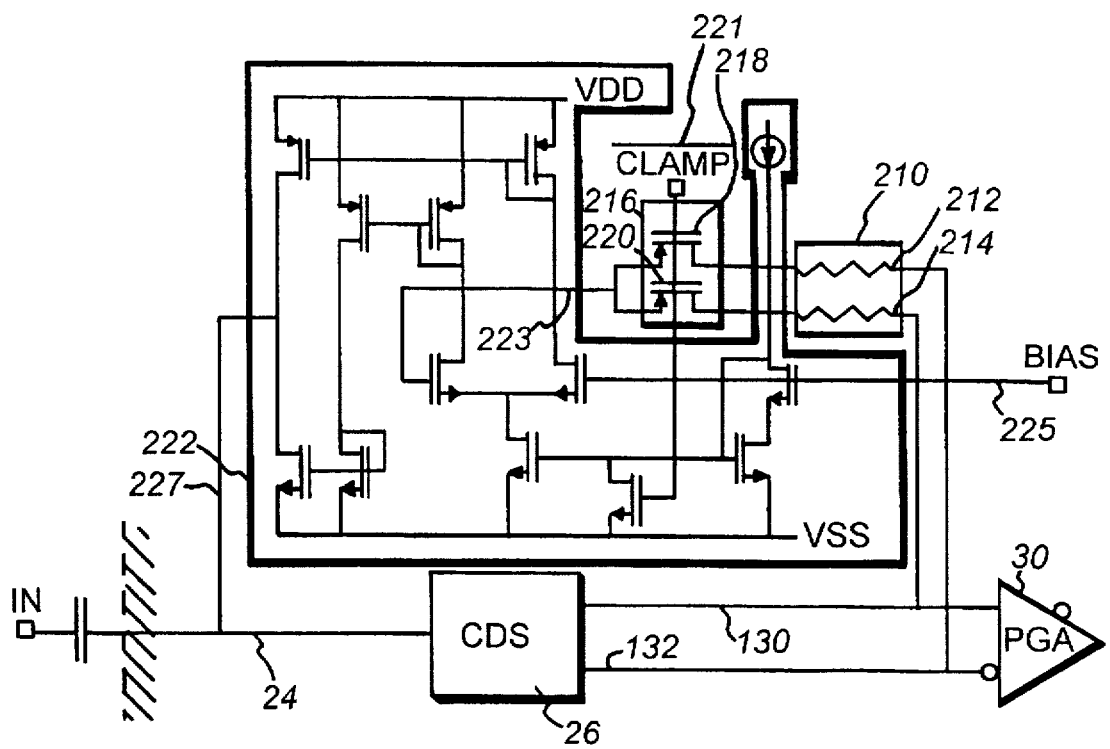
FIG. 14 is a schematic diagram of an embodiment of the input clamping circuit of FIG. 13, according to an embodiment of the invention.

Referring now to FIG. 14, there is disclosed a schematic diagram of an embodiment of the input clamping circuit of FIG. 13, according to the present invention. As discussed above, the difference signal output from the correlated double sampling circuit 26 is output on lines 130 and 132 as a differential signal to the programmable gain amplifier 30. The input clamping circuit 210, 216, 222 includes a resistive dividing circuit 210 including resistors 212 and 214 that are respectively coupled to lines 130 and 132. In addition, the input clamping circuit includes switching element 216 including switches 218 and 220 which are both responsive to a clamp control signal 221. When the clamp control signal is high, switches 218 and 220 are closed and the resistive divider 210 and switching circuit 216 combine to take an average of the differential signal on lines 130 and 132 and to provide the common mode at line 223. The common mode signal on line 223 is input to a differential amplifier 222 and is compared to a bias voltage on line 225. In particular, the differential amplifier 222 forces the output of the amplifier on line 227 which is fed back to the input of the correlated double sampling circuit on line 24 to the bias voltage. Thus, the input clamping circuit is used to clamp the voltage of the signal on line 24 to a desired voltage which is set by the bias voltage on line 225.

An advantage of the input clamping circuit is that the input clamping circuit operates independently of the black level correction circuit 77 and thus does not interfere with the black level correction circuit 77. An additional advantage of the input clamping circuit is that only one differential amplifier 222 need be used. In contrast, the input clamping circuit of FIG. 3 requires a minimum of two differential amplifiers. Still another advantage of the input clamping circuit is that the bias voltage on line 225 can be selected so that the common mode output on lines 130 and 132 is in the center of the programmable gain amplifiers limited linear range. Thus, the bias value can be selected to make optimal use of the amplifiers limited linear operating range.

Figure 15:
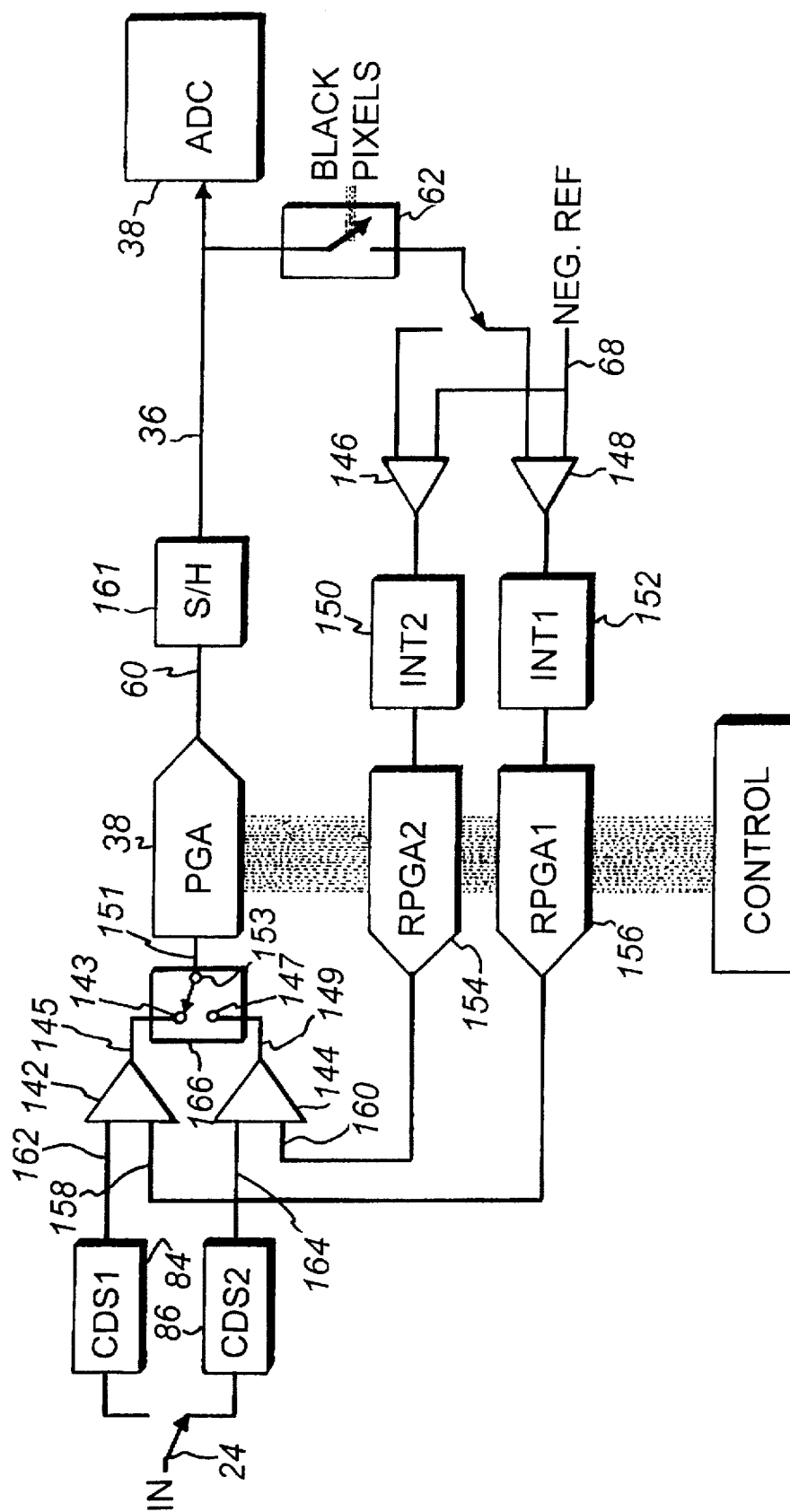
FIG. 15 is a block diagram of an charge coupled device interface according to an embodiment of the present invention.

FIG. 15 illustrates a block diagram of a charge coupled device interface according to an embodiment of the present invention. The charge coupled device interface uses the correlated double sampling circuit 71 of FIG. 6 and the black level correction circuit 77 of FIG. 10. However, since there are two CDS blocks 84 and 86 disposed in the ping-pong fashion in the correlated double sampling circuit of FIG. 6, the black level correction circuit also has two offset correction loops operating in the ping-pong fashion. In particular, summing elements 142 and 144 at the corresponding outputs of correlated double-sampling circuits 84 and 86, add a respective offset level on lines 158 and 160 to the difference signals on lines 162 and 164 before the programmable amplifier 30. A switch 166 is disposed between the summing circuits 142, 144 and the programmable amplifier 30. A throw 143 of the single-pole, double-throw switch 166 is coupled to line 145 at the output of summing circuit 142. A throw 147 of the single-pole, double-throw switch 166 is coupled to line 149 at the output of summing circuit 144. The pole 153 of the single-pole, double-throw switch 166 is coupled to line 151 at the input of programmable gain amplifier 30. Single-pole, double-throw switch 166 is switched between summing elements 142 and 144 to cover an entire pixel period of the analog signal on line 24 output from the CCD circuit 22, as was discussed above with respect to the switch 88 of the circuit of FIG. 6.

In addition, the circuit of FIG. 15 includes two respective black level correction feedback loops including respective summing elements 146, 148 and respective integrators 150, 152 which feed back the signal on line 60, at an output of sample-and-hold circuit 161, to the respective summing elements 142, 144 so as to calibrate the offset value on lines 158, 160 to yield the signal on line 60 at the negative reference value when the black level pixels are output by the CCD circuit and when the switch 62 is closed. Alternatively, when the switch 62 is opened, the integrators 150 and 152 hold the calibrated offset levels which are added to the signals on lines 162 and 164 corresponding to the intensity of the pixel level signal output by the CCD circuit 22. It is to be appreciated that the feedback loops corresponding to the black level correction circuits can also be modified as discussed above with respect to FIG. 11. For example, as is shown in FIG. 15, the respective feedback loops may also include added programmable amplifiers 154 and 156 which in the exemplary embodiment of FIG. 15 are disposed after integrators 150 and 152. Alternatively, the programmable amplifiers 154 and 156 can be disposed before the integrators 150 and 152 as was discussed above with respect to FIG. 12.

An advantage of the circuit of FIG. 15 is that the black level loop corrects input offsets to the programmable amplifier 30 by sampling the output of the programmable amplifier 30 and adjusting the input offset to the amplifier 30 appropriately.

Figure 16:
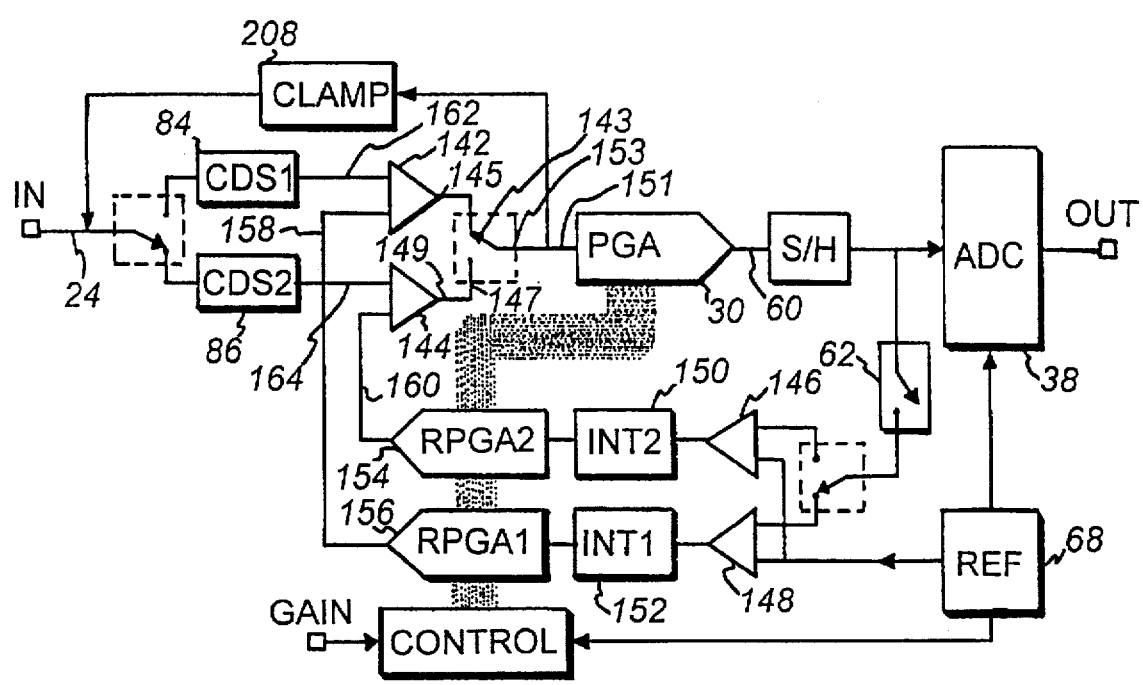
FIG. 16 is a block diagram of an alternative embodiment of the CCD interface, according to the present invention.

FIG. 16 illustrates an alternative embodiment of the charge couple device interface according to the present invention. In particular, the input clamping circuit 208 (which corresponds to the common mode feedback circuit 206 and the input clamping circuit 210, 216, 222) discussed above with respect to FIGS. 13–14 has been added to the CCD interface circuit to clamp the voltage as was discussed above. The clamp circuit 208 takes an average value of the differential signal on line 151, which is a multiplexed output of the ping-pong correlated double sampling structure 84, 86, which corresponds to CDS 71 shown in FIG. 6, and which covers an entire pixel period, and clamps the average value to a bias value at the multiplexed input 24 of correlated double sampling structure 84, 86. Otherwise, the operation of the circuit of FIG. 16 is the same as that of FIG. 15.

In the preferred embodiment of the circuit of FIG. 15, the circuit is implemented in a 0.6 micron DPDM process to yield a chip die 3.3 by 3.4 mm$^2$ in size. In addition, the chip is configured to operate on a supply voltage from 3.0 to 3.3 volts and operates on a total power consumption of 190 milliwatts. In addition, the chip operates at sample rate of 18MSPS. However, it is to be appreciated that the circuit can be implemented in many different processes on many different media and such modification is intended.

Having thus described one (several) particular embodiment(s) of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. An input clamping circuit disposed between a differential output of a correlated double-sampling circuit and an input of the correlated double-sampling circuit, that clamps a voltage of a signal at the input of the correlated double sampling circuit to a desired value, the input clamping circuit comprising:

a dividing network having a first input terminal coupled to a first output of the differential output, a second input terminal coupled to a second output of the differential output and an output terminal, that takes an average of a differential signal at the differential output of the correlated double-sampling circuit and that provides the average to the output terminal, and a differential amplifier having a first input coupled to the output terminal of the dividing network, a second input terminal coupled to a bias voltage, and an output coupled to the input of the correlated double-sampling circuit.

2. The input clamping circuit of claim 1, wherein the differential amplifier forces a signal at the output of the differential amplifier to the bias voltage.

3. The input clamping circuit of claim 1, wherein the bias voltage is selected so that a common mode of the signal at the output of the differential amplifier is a desired value within a supply and operating range of the correlated double-sampling circuit.

4. The input clamping circuit of claim 1, wherein the dividing network includes a first resistor having a first terminal coupled to the first output of the differential output and a second terminal coupled to the output terminal of the dividing network, and a second resistor having a first terminal coupled to the second output of the differential output and a second terminal coupled to the output terminal of the dividing network.

5. The input clamping circuit of claim 4, wherein the dividing network further comprises a first switch, responsive to a clock signal, having a first terminal coupled to the second terminal of the first resistor and having a second terminal coupled to the output terminal of the dividing network, and a second switch, responsive to the clock signal, having a first terminal coupled to the second terminal of the second resistor and a second terminal coupled to the output terminal of the dividing network.

6. The input clamping circuit of claim 5, wherein each of the first switch and the second switch are closed when the clock signal is in a first state such that the dividing network provides the average of the differential signal at the differential output of the correlated double-sampling circuit to the output terminal of the dividing network.

7. A camcorder system, comprising:
a charge coupled device (CCD) sensor that detects and outputs an analog signal at an output of the CCD sensor;
a CCD interface circuit, having an input coupled to the output of the CCD sensor, including;
a correlated double sampling circuit having an input coupled to the input of the CCD interface circuit, that removes any noise or offsets common to at least a first sample and a second sample of the analog signal and that outputs a differential difference signal at an output of the correlated double sampling circuit;
a clamping circuit disposed between the output of the correlated double sampling circuit and the input of the correlated double sampling circuit, that clamps an average value of the differential difference signal at the output of the correlated double sampling circuit to a selected voltage value that is fed back to the input of the correlated double sampling circuit;
a black level correction circuit having a first input coupled to the output of the correlated double sampling circuit and a second input coupled to an offset level signal, that adds a calibrated value of the offset level signal to the differential difference signal and that outputs a resulting signal at an output of the black level correction circuit; and
an analog-to-digital converter having an input coupled to the output of the black level correction circuit, that converts the resulting signal to a digital signal and that outputs the digital signal at an output of the analog-to-digital converter.

8. The camcorder system of claim 7, wherein the clamping circuit comprises:
a dividing network having a first input terminal coupled to the output of the correlated double sampling circuit and a second input terminal coupled to the output of the correlated double sampling circuit that takes the average value of the differential difference signal at the output of the correlated double-sampling circuit and that provides the average to an output terminal; and
a differential amplifier having a first input coupled to the output terminal of the dividing network, a second input terminal coupled to a bias voltage, and an output coupled to the input of the correlated double sampling circuit.

9. The camcorder system of claim 8, wherein the differential amplifier forces a signal at the output of the differential amplifier to the bias voltage.

10. The camcorder system of claim 8, wherein the bias voltage is selected so that a common mode of the signal at the output of the differential amplifier is a desired value within a supply and operating range of the correlated double-sampling circuit.

11. The camcorder system of claim 8, wherein the dividing network includes a first resistor having a first terminal coupled to the first input terminal of the dividing network and a second terminal coupled to the output terminal of the dividing network, and a second resistor having a first terminal coupled to the second input terminal of the dividing network and a second terminal coupled to the output terminal of the dividing network.

12. The camcorder system of claim 11, wherein the dividing network further comprises a first switch, responsive to a clock signal, having a first terminal coupled to the second terminal of the first resistor and having a second terminal coupled to the output terminal of the dividing network, and a second switch responsive, to the clock signal, having a first terminal coupled to the second terminal of the second resistor and a second terminal coupled to the output terminal of the dividing network.

13. The camcorder system of claim 12, wherein each of the first switch and the second switch are closed when the clock signal is in a first state such that the dividing network provides the average value of the differential difference signal at the output of the correlated double-sampling circuit to the output terminal of the dividing network.

14. An integrated circuit, comprising:
a first correlated double sampling circuit having a first input and a first output, the first correlated double sampling circuit taking a first sample of an analog signal at the first input, taking a second sample of the analog signal at the first input and taking a difference between the first sample and the second sample to provide a first filtered signal at the first output;
a second correlated double sampling circuit having a second input coupled to the first input and a second output, the second correlated double sampling circuit taking a third sample of the analog signal at the first input and a fourth sample of the analog signal at the first input and taking a difference between the third sample and the fourth sample to provide a second filtered signal at the second output;
a first summing circuit having a first input coupled to the first output and a second input coupled to a first reference value, that sums the first filtered signal and the first reference value and provides at an output a first summed signal;
a second summing circuit having a first input coupled to the second output and a second input coupled to a second reference value, that sums the second filtered signal with the second reference value and provides at an output a second summed signal;
a first switching circuit having a first input coupled to the output of the first summing circuit, a second input coupled to the output of the second summing circuit, that alternately provides a differential first selected signal as one of the first summed signal and the second summed signal to an output of the first switching circuit;

a clamping circuit disposed between the output of the first switching circuit and the first input of the first correlated double-sampling circuit, that clamps an average value of the differential first selected signal at the output of the switching circuit to a selected voltage value and that feeds the average value of the differential first selected signal back to the first input;

a first programmable amplifier having an input coupled to the output of the first switching circuit that amplifies the differential first selected signal and provides an amplified signal at an output of the first programmable amplifier;

a second switching circuit having an input coupled to the output of the first programmable amplifier, that alternately provides the amplified signal as a second selected signal to one of a first output and a second output of the second switching circuit;

a third summing circuit having a first input coupled to the first output of the second switching circuit and a second input coupled to a reference signal, that sums the second selected signal with the reference signal and that provides a third summed signal at an output of the third summing circuit;

a fourth summing circuit having a first input coupled to the second output of the second switching circuit and a second input coupled to the reference signal, that sums the second selected signal with the reference signal and that provides at an output of the fourth summing circuit a fourth summed signal;

a first integration circuit having an input coupled to the output of the third summing circuit, that integrates the third summed signal and that provides at an output, coupled to the second input of the first summing circuit, a first integrated signal as the first reference value;

a second integration circuit having an input coupled to the output of the fourth summing circuit, that integrates the fourth summed signal and that provides at an output, coupled to the second input of the second summing circuit, a second integrated signal as the second reference value.

15. The integrated circuit of claim 14, further comprising a second programmable amplifier having an input coupled to the output of the first integration circuit and an output coupled to the second input of the first summing circuit, the second programmable amplifier amplifying the first integrated signal to provide the first reference value.

16. The integrated circuit of claim 15, further comprising a third programmable amplifier having an input coupled to the output of the second integration circuit and an output coupled to the second input of the second summing circuit, the third programmable amplifier amplifying the second integrated signal to provide the second reference value.

17. The integrated circuit of claim 14, wherein the clamping circuit comprises:

a dividing network having a first input terminal coupled to the output of the first switching circuit and a second input terminal coupled to the output of the first switching circuit, that takes an average of the differential first selected signal at the output of the first switching circuit and that provides the average to an output terminal; and a differential amplifier having a first input coupled to the output terminal of the dividing network, a second input terminal coupled to a bias voltage, and an output coupled to the first input of the first correlated double sampling circuit.

18. The integrated clamping circuit of claim 17, wherein the differential amplifier forces a signal at the output of the differential amplifier to the bias voltage.

19. The integrated circuit of claim 17, wherein the bias voltage is selected so that a common mode of the signal at the output of the differential amplifier is a desired value within a supply and operating range of the first and second correlated double sampling circuits.

20. The integrated circuit of claim 17, wherein the dividing network includes a first resistor having a first terminal coupled to the first input terminal of the dividing network and a second terminal coupled to the output terminal of the dividing network, and a second resistor having a first terminal coupled to the second input terminal of the dividing network and a second terminal coupled to the output terminal of the dividing network.

21. The integrated circuit of claim 20, wherein the dividing network further comprises a first switch, responsive to a clock signal, having a first terminal coupled to the second terminal of the first resistor and having a second terminal coupled to the output terminal of the dividing network, and a second switch, responsive to the clock signal, having a first terminal coupled to the second terminal of the second resistor and a second terminal coupled to the output terminal of the dividing network.

22. The integrated circuit of claim 21, wherein each of the first switch and the second switch are closed when the clock signal is in a first state such that the dividing network provides the average of the differential first selected signal at the output of the first switching circuit to the output terminal of the dividing network.

* * * * *